United States Patent [19]
Hsu et al.

[11] Patent Number: 6,054,382
[45] Date of Patent: Apr. 25, 2000

[54] METHOD OF IMPROVING TEXTURE OF METAL FILMS IN SEMICONDUCTOR INTEGRATED CIRCUITS

[75] Inventors: Wei-Yung Hsu; Qi-Zhong Hong, both of Dallas, Tex.

[73] Assignee: Texas Instruments Incorporated, Dallas, Tex.

[21] Appl. No.: 08/820,729

[22] Filed: Mar. 19, 1997

[51] Int. Cl.⁷ .............................................. H01L 21/4763
[52] U.S. Cl. ........................... 438/628; 438/643; 438/648
[58] Field of Search .................................... 438/628, 643, 438/648

[56] References Cited

U.S. PATENT DOCUMENTS

| | | | |
|---|---|---|---|
| 4,960,732 | 10/1990 | Dixit et al. | 437/192 |
| 5,162,262 | 11/1992 | Ajika et al. | 437/200 |
| 5,242,860 | 9/1993 | Nulman et al. | 437/190 |
| 5,371,041 | 12/1994 | Liou et al. | 437/192 |
| 5,397,742 | 3/1995 | Kim | 437/190 |
| 5,661,080 | 8/1997 | Hwang et al. | 438/654 |
| 5,804,249 | 9/1998 | Sukharev et al. | 438/656 |
| 5,851,912 | 12/1998 | Liaw et al. | 438/621 |

*Primary Examiner*—John F. Niebling
*Assistant Examiner*—Michael S. Lebentritt
*Attorney, Agent, or Firm*—Jacqueline J. Garner; Wade James Brady; Richard L. Donaldson

[57] ABSTRACT

A method is provided for improving the texture of a metal interconnect (32) in a semiconductor device (10). A first layer of titanium (24), a layer of titanium nitride (26), a second layer of titanium (28), and a metal film (30) are sequentially formed over an oxide layer (12). The second titanium layer (28) is preferably out 10–20 nm thick. Because the metal film (30) is formed over the second titanium layer (28), any metal interconnect (32) that is formed as a part of the metal film (30) has a strong (111) crystalline orientation. Furthermore, because the second titanium layer (28) is relatively thin, the metal film (30) and metal interconnect (32) are not completely transformed into a metal compound having a high electrical resistance.

15 Claims, 1 Drawing Sheet

METHOD OF IMPROVING TEXTURE OF METAL FILMS IN SEMICONDUCTOR INTEGRATED CIRCUITS

TECHNICAL FIELD OF THE INVENTION

This invention relates generally to the field of semiconductor integrated circuit fabrication, and more particularly, to a method for improving the texture of metal films in a semiconductor integrated circuit.

BACKGROUND OF THE INVENTION

Electromigration is the movement of atoms through a metal conductor (such as aluminum, for example) in response to the passage of current through the conductor. Over a period of time, electromigration causes voids (absences of metal) to form in the metal conductor. In a semiconductor integrated circuit, these voids can ultimately grow large enough to form an open circuit in the conductor and cause it, and the integrated circuit, to fail. Therefore, electromigration is a known "wearout" characteristic of a semiconductor device.

However, if a metal conductor can be fabricated with a strong (111) crystalline orientation or "texture," that conductor will be more resistant to the effects of electromigration. Specifically, a strong (111) texture in a metal conductor will reduce the motion (migration) of atoms as a current flows through the conductor.

Standard sputtering techniques have been optimized to produce strong (111) textures in metallization layers in semiconductor devices with tungsten deposited by chemical vapor deposition to fill both vias between metallization layers and contacts to junction or gate. Aluminum alloy or copper alloy, however, is preferred over tungsten in order to increase the speed of a semiconductor device and reduce the cost of processing. Unfortunately, standard sputtering techniques do not provide the necessary step coverage to fill vias or contacts using aluminum alloy or copper alloy. Consequently, for aluminum alloy or copper alloy, other contact forming techniques have been used, such as high temperature reflow (e.g., at temperatures greater than 500° C.), high pressure extrusion (e.g., at pressures greater than 60 M Pa), or chemical vapor deposition process.

In chemical vapor deposition processes and high pressure via/contact filling techniques for aluminum alloy or copper alloy, metal interconnects are formed by sequentially depositing a layer of titanium, a layer of titanium nitride, and a layer of metal within a via or contact, on an oxide layer. The layer of titanium functioned to reduce electrical resistance in the via or contact. The titanium nitride layer functioned to prevent the layer of titanium from reacting with the metal layer. Otherwise, the reaction would have transformed the metal layer into a metallic compound having highly resistive properties, thereby reducing the effectiveness of the metal layer as a conductor. Typically, the titanium nitride layer is deposited by chemical vapor deposition or long-throw sputtering geometry process to improve the step coverage. However, these two methods of depositing titanium nitride produced a titanium nitride layer with poor (111) texture, thus resulting in a weak (111) crystalline structure for any metal layer deposited over the titanium nitride layer. Consequently, any metal interconnects that were part of the metal layer were unreliable because of electromigration effects.

SUMMARY OF THE INVENTION

Accordingly, a need has arisen for a method for improving the texture of metal interconnects between metallization layers in a semiconductor device.

According to a preferred embodiment of the present invention, a method is provided for improving the texture of a metal interconnect in a semiconductor device. The device preferably has a layer of titanium, a layer of titanium nitride, a second layer of titanium, and a metal film sequentially formed over an oxide layer. The second titanium layer is preferably about 10–20 nm thick. Because the metal film is formed over the second titanium layer, any metal interconnect that is formed as part of the metal film has a strong (111) crystalline orientation. Furthermore, the second titanium layer is relatively thin. Consequently, reaction between the second titanium layer and the metal interconnect is reduced.

An important technical advantage of the present invention is that a metal interconnect is formed that has an improved (111) texture, which is more resistant to the effects of electromigration.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1A–1E of the drawings, like numerals being used for like and corresponding parts of the various drawings.

In accordance with a preferred embodiment of the present invention, a metal layer is formed over a relatively thin layer of titanium in order to improve the texture of the metal layer, while preserving the metal layer's effectiveness as a conductor. Specifically, the deposition of certain metals (e.g., aluminum) over a layer of titanium produces a strong (111) crystalline orientation in the deposited metal. Because the layer of titanium is relatively thin, the reaction of this metal layer with the titanium layer is reduced.

Figure 1A:
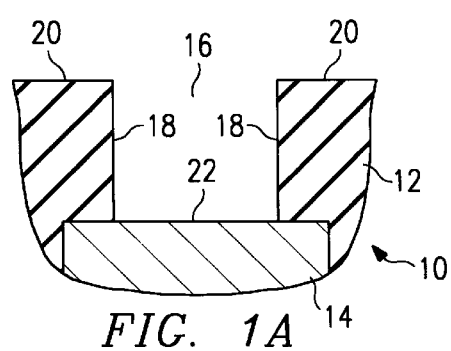
FIGS. 1A–1E are sectional views illustrating a method of forming a metal interconnect with improved texture in a semiconductor device, according to a preferred embodiment of the present invention.

FIGS. 1A–1E are sectional views illustrating a method of forming a semiconductor device 10, according to the preferred embodiment of the present invention. Referring to FIG. 1A, device 10 includes an oxide layer 12 and a metal conductor 14.

Oxide layer 12 may be formed from silicon dioxide ($SiO_2$) or any other material which functions to insulate metal conductor 14 from other conductors in device 10, such as, for example, any metallization layers that are formed over oxide layer 12. A via 16 is formed within oxide layer 12. Oxide layer 12 can have a plurality of surfaces, including at least one sidewall oxide surface 18 and at least one top oxide surface 20.

Metal conductor 14, which is disposed beneath oxide layer 12, may be part of a metallization layer in device 10. Metal conductor 14 can be formed from any one of a variety of metals or metal alloys, such as, for example, copper (Cu), aluminum (Al), or tungsten (W). Metal conductor 14 has a metal surface 22, which is exposed at the bottom of via 16.

Figure 1B:
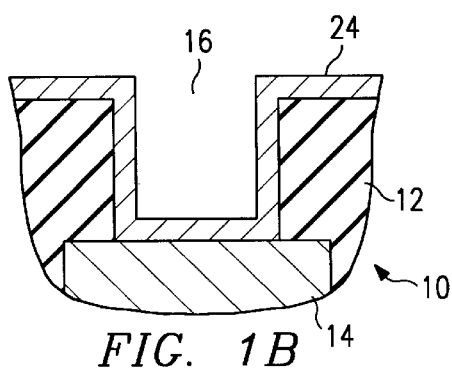

Referring to FIG. 1B, a first layer of titanium 24 is formed over device 10 by chemical vapor deposition, for example. First titanium layer 24 covers oxide layer 12 and metal conductor 14 at sidewall oxide surfaces 18, top oxide surfaces 20, and metal surface 22. First titanium layer 24 is composed primarily of titanium with a thickness of approximately 20–100 nm. Alternatively, layer 24 may be formed from a titanium-aluminum alloy composition defined by the formula $TiAl_X$. First titanium layer 24 functions to reduce the electrical resistance in via 16 between metal conductor 14 and any subsequently formed metal layer (e.g., metal interconnect or metallization layer). Because first titanium layer 24 can be deposited in a strong textured microstructure, first titanium layer 24 also functions to control the crystalline texture of a subsequently formed titanium nitride layer.

Figure 1C:
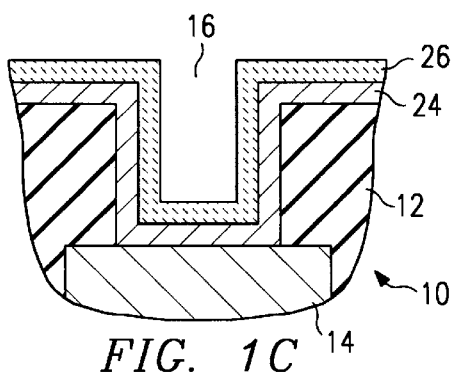

Referring to FIG. 1C, a titanium nitride layer 26 can be formed over first titanium layer 24. Titanium nitride layer 26 can be deposited by physical vapor deposition, such as collimated sputtering, long-throw sputtering, or accelerated ion sputtering. Alternatively, titanium nitride layer 26 can be deposited by chemical vapor deposition with inorganic material (e.g., titanium chloride ($TiCl_4$) or titanium iodide ($TiI_4$)) or metaorganic material (e.g., tetrakis-dimethylamino titanium (TDMAT)) to provide adequate step coverage. Titanium nitride layer 26 is composed primarily of titanium nitride with a thickness preferably in the range of 20–50 nm. In another embodiment, layer 26 may be formed from a titanium-aluminum-nitrogen composition defined by the formula $Ti_XAl_{1-X}N$, where the subscripts 1-X and X establish the proportion of titanium relative to aluminum in layer 26. As described in more detail below, titanium nitride layer 26 functions to prevent the diffusion of titanium atoms out of the first titanium layer 24 into any metal layers that are subsequently formed over titanium nitride layer 26.

Figure 1D:
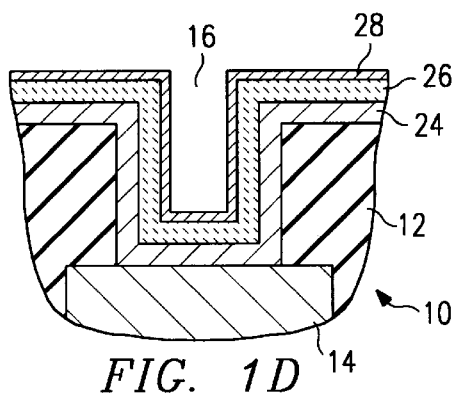

Referring to FIG. 1D, a second titanium layer 28 is formed over titanium nitride layer 26. Second titanium layer 28 is preferably deposited by standard physical vapor deposition process in order to provide poor step coverage on the sidewall surfaces of via 16, thereby minimizing the reaction of a subsequently formed metal layer with second titanium layer 28 within via 16. Second titanium layer 28 is composed primarily of titanium, or alternatively, a titanium-aluminum alloy composition defined by the formula $TiAl_X$. Second titanium layer 28 can be formed approximately 10–20 nm in thickness, which is relatively thin in comparison to the thickness of the first titanium layer 24.

Figure 1E:
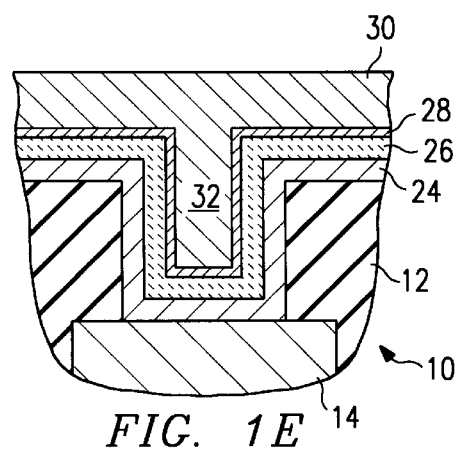

Referring to FIG. 1E, a metal layer or film 30 is formed over device 10. Metal film 30, which covers second titanium layer 28, may be deposited by chemical vapor deposition, high temperature reflow, high pressure extrusion, or any other suitable process to fill via 16. For example, the aluminum via contact filling process known as the "FORCE-FILL" process can be used to deposit metal film 30. Metal film 30 may comprise aluminum or an aluminum alloy, for example. The formation of metal film 30 creates a metal interconnect 32 within via 16.

Because metal film 30 is formed over a layer of titanium (i.e., second titanium layer 18), metal film 30 and metal interconnect 32 have a strong (111) crystalline orientation. Consequently, metal interconnect 32 is less susceptible to the effects of electromigration than prior metal interconnects. Additionally, because second titanium layer 28 is relatively thin (e.g., about 10–20 nm), metal film 30 and metal interconnect 32 are not completely transformed into a metal compound having high electrical resistance. Moreover, titanium nitride layer 26 prevents additional titanium atoms from diffusing out of first titanium layer 24 into metal film 30 and metal interconnect 32. Consequently, the relatively thick first titanium layer 24 is unable to react with metal film 30 and metal interconnect 32 and transform the film and interconnect into a metal compound having a high electrical resistance. Consequently, in accordance with the teachings of the present invention, a metal interconnect 32 having improved (111) crystalline texture can be formed in via 16 between metal conductor 14 and any subsequently formed metallization layer.

Although the present invention and its advantages have been described in detail, it should be understood that various changes, substitutions, and alterations can be made herein without departing from the spirit and scope of the invention, as defined by the appended claims.

What is claimed is;:

1. A method for improving the texture of a metal film in a semiconductor device, comprising the steps of:
    forming a first layer of titanium over an oxide layer of material;
    forming a layer of titanium nitride over said first titanium layer;
    forming a second layer of titanium over said titanium nitride layer; and
    forming a metal film over said second titanium layer.

2. The method of claim 1, wherein said metal film comprises a layer of aluminum.

3. The method claim 1, wherein said step of forming a metal film further comprises the step of depositing a metal layer by a chemical vapor deposition, high-temperature reflow, or high-pressure extrusion process.

4. The method of claim 1, wherein said step of forming a first titanium layer further comprises the step of depositing a layer of titanium by a chemical vapor deposition process.

5. The method of claim 1, wherein said metal film further comprises a metal interconnect.

6. The method of claim 1, wherein said step of forming a titanium nitride layer further comprises the step of depositing a layer of titanium nitride by a physical vapor deposition or chemical vapor deposition process.

7. The method of claim 1, wherein said step of forming a second titanium layer further comprises the step of depositing a layer of titanium by a physical vapor deposition process.

8. The method of claim 1, wherein said first titanium layer is approximately 20–100 nm thick.

9. The method of claim 1, wherein said titanium nitride layer is approximately 20–50 nm thick.

10. The method of claim 1, wherein said second titanium layer is approximately 10–20 nm thick.

11. A method for improving the texture of a metal interconnect in a semiconductor device having an oxide layer with a via formed therein, comprising the steps of:
    forming a first layer of titanium in said via;
    forming a layer of titanium nitride over said first titanium layer;
    forming a second layer of titanium over said titanium nitride layer; and
    forming a metal interconnect over said second titanium layer.

12. The method of claim 11, wherein said step of forming a metal interconnect further comprises the step of depositing a metal layer by a chemical vapor deposition, high-temperature reflow, or high-pressure extrusion process.

13. The method of claim 11, wherein said step of forming a first titanium layer further comprises the step of depositing a layer of titanium by a chemical vapor deposition process.

14. The method of claim 11, wherein said step of forming a titanium nitride layer further comprises the step of depositing a layer of titanium nitride by a physical vapor deposition or chemical vapor deposition process.

15. The method of claim 11, wherein said step of forming a second titanium layer further comprises the step of depositing a layer of titanium by a physical vapor deposition process.

* * * * *

UNITED STATES PATENT AND TRADEMARK OFFICE
CERTIFICATE OF CORRECTION

PATENT NO. : 6,054,382
DATED : April 25, 2000
INVENTOR(S) : Monte A. Douglas and Allen C. Templeton It is certified that error appears in the above-identified patent and that said Letters Patent is hereby corrected as shown below:

On the title page, please insert the following after " Related U.S. Application No. 60/014,256 filed 03/28/96.

Signed and Sealed this

Twenty-seventh Day of February, 2001

Attest:

NICHOLAS P. GODICI

Attesting Officer

Acting Director of the United States Patent and Trademark Office